(12) United States Patent
Lee

(10) Patent No.: US 8,497,585 B2
(45) Date of Patent: Jul. 30, 2013

(54) CHIP PACKAGE

(75) Inventor: Ming-Chiang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/173,255

(22) Filed: Jun. 30, 2011

(65) Prior Publication Data

US 2011/0260327 A1    Oct. 27, 2011

Related U.S. Application Data

(63) Continuation of application No. 12/556,841, filed on Sep. 10, 2009, now Pat. No. 7,993,982.

(30) Foreign Application Priority Data

Dec. 9, 2008    (TW) ................................ 97147881 A

(51) Int. Cl.
*H01L 23/48* (2006.01)
*H01L 23/28* (2006.01)

(52) U.S. Cl.
USPC ................. 257/784; 257/787; 257/E23.024

(58) Field of Classification Search
USPC .............................. 257/784, 787, E23.024, 779
See application file for complete search history.

(56) References Cited

U.S. PATENT DOCUMENTS

| | | | | |
|---|---|---|---|---|
| 5,900,676 A | * | 5/1999 | Kweon et al. | 257/787 |
| 5,976,912 A | * | 11/1999 | Fukutomi et al. | 438/110 |
| 6,031,292 A | * | 2/2000 | Murakami et al. | 257/778 |
| 6,153,928 A | * | 11/2000 | Cho | 257/686 |
| 6,451,627 B1 | * | 9/2002 | Coffman | 438/111 |
| 6,548,328 B1 | * | 4/2003 | Sakamoto et al. | 438/121 |
| 7,087,462 B1 | * | 8/2006 | Park et al. | 438/112 |
| 7,122,406 B1 | | 10/2006 | Yilmaz et al. | |
| 2002/0024147 A1 | | 2/2002 | Jung et al. | |
| 2003/0164549 A1 | * | 9/2003 | Nakayama | 257/777 |
| 2004/0097017 A1 | * | 5/2004 | Shimanuki | 438/124 |
| 2007/0023896 A1 | * | 2/2007 | Dangelmaier et al. | 257/728 |

OTHER PUBLICATIONS

"Office Action of Taiwan Counterpart Application", issued on Apr. 25, 2012, p1-p4, in which the listed reference was cited.
"Second Office Action of China Counterpart Application", issued on Feb. 22, 2012, p1-p3, in which the listed reference was cited.

* cited by examiner

*Primary Examiner* — Nitin Parekh
(74) *Attorney, Agent, or Firm* — J.C. Patents

(57) ABSTRACT

A quad flat non-leaded package including a first patterned conductive layer, a second patterned conductive layer, a chip, bonding wires and a molding compound is provided. The first patterned conductive layer defines a first space, and the second patterned conductive layer defines a second space, wherein the first space overlaps the second space and a part of the second patterned conductive layer surrounding the second space. The chip is disposed on the second patterned conductive layer. The bonding wires are connected between the chip and the second patterned conductive layer. The molding compound encapsulates the second patterned conductive layers, the chip and the bonding wires. In addition, a method of manufacturing a quad flat non-leaded package is also provided.

12 Claims, 9 Drawing Sheets

CHIP PACKAGE

CROSS-REFERENCE TO RELATED APPLICATION

This is a continuation application of and claims the priority benefit of U.S. application Ser. No. 12/556,841, filed on Sep. 10, 2009, now allowed, which claims the priority benefit of Taiwan patent application serial no. 97147881, filed on Dec. 9, 2008. The entirety of each of the above-mentioned patent applications is hereby incorporated by reference herein and made a part of this specification.

BACKGROUND OF THE INVENTION

1. Field of the Invention

The present invention generally relates to a quad flat package (QFP) and manufacturing method thereof. More particularly, the present invention relates to a quad flat non-leaded (QFN) package and manufacturing method thereof.

2. Description of Related Art

Production of integrated circuits (IC) includes IC design, IC process and IC package. The package of IC prevents the chip from effects of external temperature, humidity and contamination, and provides medium of electric connection between the chip and external circuits.

Chip package are categorized in various package types, wherein the quad flat non-leaded package belonging to the category of quad flat package and characterized by short signal transmission path and rapid signal transmission speed is suitable for high frequency chip package and thus being a main stream of low pin count package.

In the manufacturing method of quad flat non-leaded package, chips are disposed on a leadframe. Then, the chips are electrically connected to the leadframe via bonding wires. Next, patterned conductive layers, the bonding wires and the chip are encapsulated by a molding compound. Thereafter, the aforementioned structure is singularized to form a plurality of quad flat non-leaded packages.

SUMMARY OF THE INVENTION

Accordingly, the present invention is directed to a quad flat non-leaded package capable of reducing package thickness.

The present invention is also directed to a manufacturing method of a quad flat non-leaded package with low manufacturing cost.

As embodied and broadly described herein, the present invention provides a quad flat non-leaded package, comprising: a first patterned conductive layer defining a first space having a pattern complementary to a pattern of the first patterned conductive layer; a second patterned conductive layer defining a second space having a pattern complementary to a pattern of the second patterned conductive layer, wherein the first space overlaps the second space and a part of the second patterned conductive layer surrounding the second space; a chip disposed on the second patterned conductive layer, wherein the second patterned conductive layer is located between the chip and the first patterned conductive layer; a plurality of bonding wires connected between the chip and the second patterned conductive layer; and a molding compound encapsulating the second patterned conductive layer, the chip and the bonding wires.

The present invention also provides a method of manufacturing a quad flat non-leaded package. The method comprises: providing a sacrificed layer, two release films and two metal layers; stacking the sacrificed layer between the two release films and stacking the two release films and the sacrificed layer between the two metal layers, wherein each release film exposes a part of the sacrificed layer, and each metal layer covers one of the release films and the part of the sacrificed layer exposed by the release film; forming a first mask layer on each metal layer, wherein each first mask layer exposes a part of the corresponding metal layer; forming a first patterned conductive layer on the part of the metal layer exposed by each first mask layer; removing each first mask layer and each first patterned conductive layer exposes a part of the corresponding metal layer; forming a dielectric layer on the part of the corresponding metal layer exposed by each first patterned conductive layer; cutting the dielectric layers, the metal layers, the release films and the sacrificed layer; removing the sacrificed layer and the release films after cutting the dielectric layers, the metal layers, the release films and the sacrificed layer; removing the metal layers after removing the sacrificed layer and the release films; disposing at least one chip on each first patterned conductive layer; and forming a plurality of bonding wires to electrically connect each chip to the corresponding first patterned conductive layer.

The present invention provides further another method of manufacturing a quad flat non-leaded package. The method comprises: providing a sacrificed layer, two release films and two metal layers; stacking the sacrificed layer between the two release films and stacking the two release films and the sacrificed layer between the two metal layers, wherein each release film exposes a part of the sacrificed layer, and each metal layer covers one of the release films and the part of the sacrificed layer exposed by the release film; forming a first mask layer on each metal layer, wherein each first mask layer exposes a part of the corresponding metal layer; forming a first patterned conductive layer on the part of the metal layer exposed by each first mask layer; cutting the dielectric layers, the metal layers, the release films and the sacrificed layer; removing the sacrificed layer and the release films after cutting the dielectric layers, the metal layers, the release films and the sacrificed layer; removing the metal layers after removing the sacrificed layer and the release films; disposing at least one chip on each first patterned conductive layer; forming a plurality of bonding wires to electrically connect each chip to the corresponding first patterned conductive layer; forming a plurality of molding compounds, wherein each molding compound encapsulates the corresponding chip and the bonding wires connected to the chip; and removing the first mask layers.

The present invention disposes release films on a part area of the sacrificed layer in manufacturing process of the quad flat non-leaded package, such that the metal layers can be adhered to the remained area of the sacrificed layer exposed by the release films. Then, the remained area of the sacrificed layer exposed by the release films is removed and the metal layers can separate from the sacrificed layer as the release films peeling from the sacrificed layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
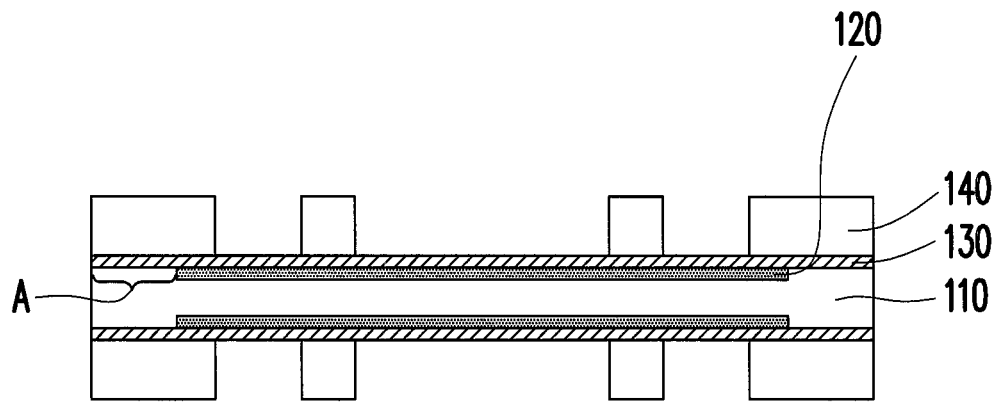
FIGS. 1A to 1H are sectional views illustrating a method of manufacturing a quad flat non-leaded package according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1H are sectional views illustrating a method of manufacturing a quad flat non-leaded package according to an embodiment of the present invention. First, referring to FIG. 1A, a sacrificed layer 110, two release films 120 and two metal layers 130 are provided. Then, the sacrificed layer 110 is stacked between the two release films 120, and the two release films 120 and the sacrificed layer 110 are stacked between the two metal layers 130. Each release film 120 is embedded into the sacrificed layer 110 and exposes a part of the sacrificed layer 110. Each metal layer 130 covers the corresponding release film 120 and the part of the sacrificed layer 110 exposed by the release film 120. Then, a first mask layer 140 is formed on each metal layer 130, wherein each first mask layer 140 exposes a part of its corresponding metal layer 130.

It should be noted that the release films 120 are not completely cover the sacrificed layer 110, such that the area A of the sacrificed layer 110 exposed by the release films 120 can be adhered with the metal layers 130.

Figure 1B:
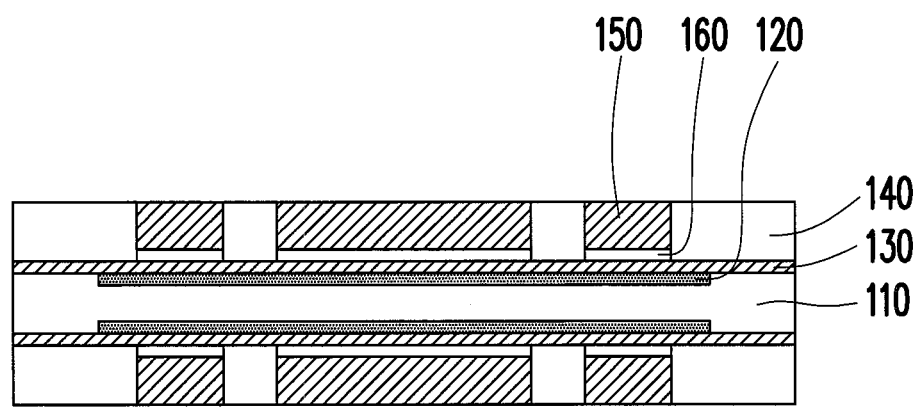

Referring to FIG. 1B, a first patterned conductive layer 150 is formed on the part of each metal layer 130 exposed by the corresponding first mask layer 140. In addition, in this embodiment, further a first oxidation prevention layer 160 can be formed on the part of each metal layer 130 exposed by the corresponding first mask layer 140 before the first patterned conductive layers 150 are formed.

Figure 1C:
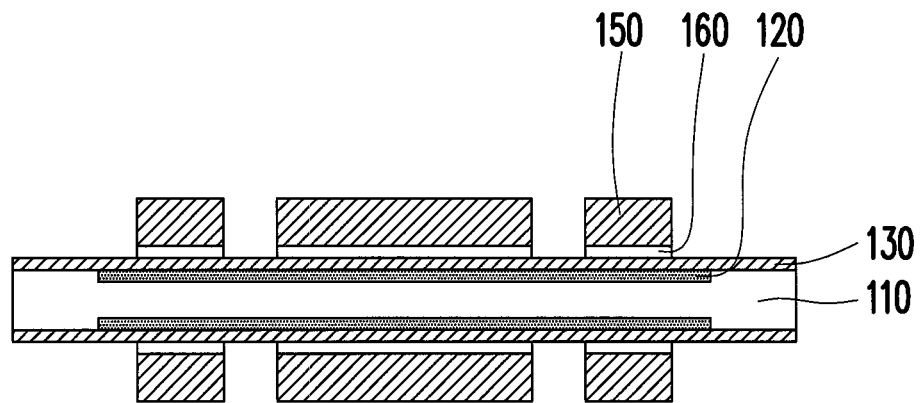

Referring to FIG. 1C, the first mask layers 140 are removed such that each first patterned conductive layer 150 exposes a part of the corresponding metal layer 130. Then, referring to FIG. 1D, a dielectric layer 170 is formed on the part of each metal layer 130 exposed by its corresponding first patterned conductive layer 150.

Figure 1D:
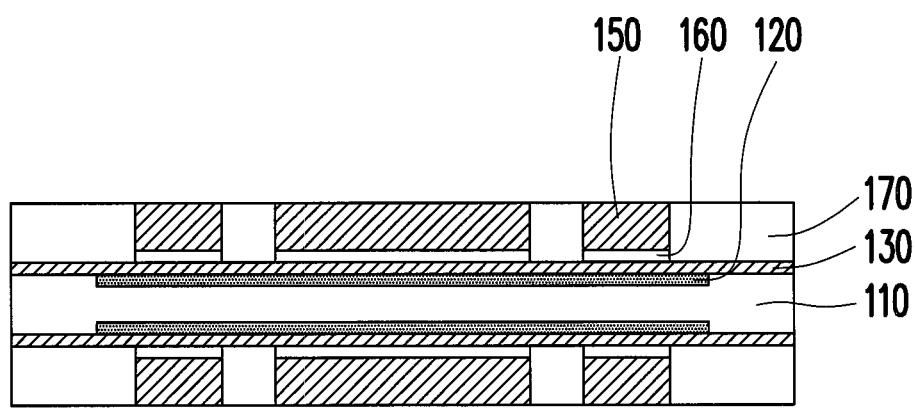
Figure 1E:
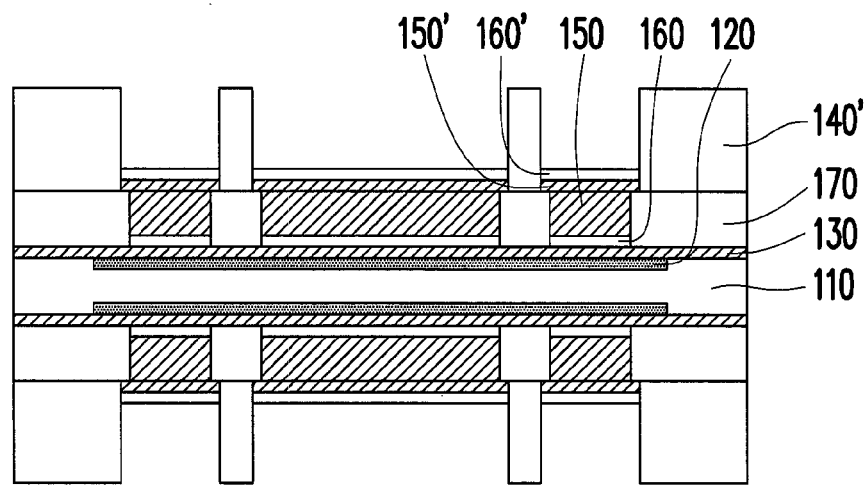

Referring to FIG. 1E, a second mask layer 140' is formed on each dielectric layer 170, wherein each second mask layer 140' exposes the corresponding first patterned conductive layer 150 and a part of the dielectric layer 170 surrounding the first patterned conductive layer 150. Then, a second patterned conductive layer 150' is formed on the corresponding first patterned conductive layer 150 and the part of the dielectric layer 170 surrounding the first patterned conductive layer 150. In this embodiment, a second oxidation prevention layer 160' can further be formed on each second patterned conductive layer 150'.

Figure 1F:
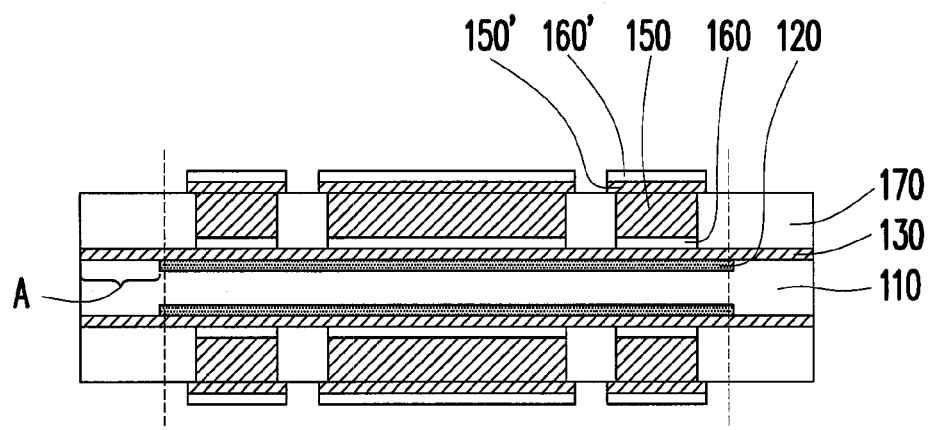
Figure 1G:
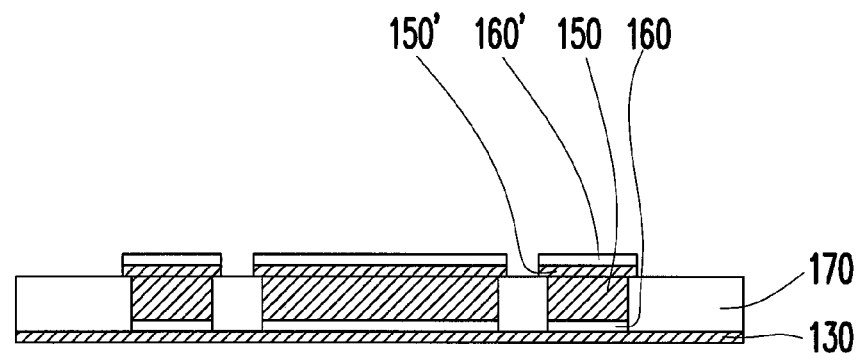

Referring to FIGS. 1F and 1G, the second mask layers 140' are removed. Then, the dielectric layers 170, the metal layers 130, the release films 120 and the sacrificed layer 110 are cut to remove the area A of the sacrificed layer 110 exposed by the release films 120. Then, the sacrificed layer 110 and the release films 120 are removed.

There exists temporary bonding force between the metal layers 130 and the release films 120 and the method of separating the metal layers 130 from the release films 120 should eliminate the bonding force therebetween. The metal layers 130 and the release films 120 can be separated by chemical or physical manners. In this embodiment, the method of removing the sacrificed layer 110 and the release films 120 comprises peeling the metal layers 130 from their corresponding release films 120 in a physical manner.

It should be noted that the above step of removing the area A of the sacrificed layer 110 exposed by the release films 120 brings the metal layers 130 isolated from the sacrificed layer 110 by their corresponding release films 120, such that the metal layers 130 can be peeled from their corresponding release films 120 easily.

Figure 1H:
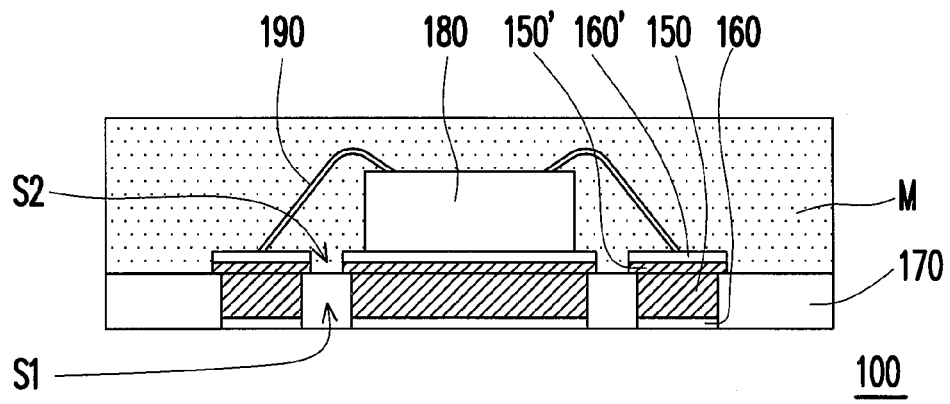

Referring to FIG. 1H, a chip 180 is disposed on the second patterned conductive layer 150'. Bonding wires 190 are formed to electrically connect the chip 180 to the patterned conductive layer 150 and the second patterned conductive layer 150'. A molding compound M is formed to encapsulate the chip 180 and the bonding wires 190. Then, the metal layer 130 is removed to form a quad flat non-leaded package 100. In this embodiment, the metal layer 130 is for example removed by etching.

It should be noted that in another embodiment not shown, plural and corresponding chips, bonding wires and molding compounds are provided to obtain a plurality of quad flat non-leaded packages after a singulation process.

Referring to FIG. 1H, the quad flat non-leaded package 100 of the present embodiment comprises a first patterned conductive layer 150, a second patterned conductive layer 150', a chip 180, a plurality of bonding wires 190 and a molding compound M. The first patterned conductive layer 150 defines a first space S1 having a pattern complementary to that of the first patterned conductive layer 150. The second patterned conductive layer 150' defines a second space S2 having a pattern complementary to that if the second patterned conductive layer 150'. The first space S1 overlaps the second space S2 and a part of the second patterned conductive layer 150' surrounding the second space S2.

The chip 180 is disposed on the second patterned conductive layer 150', wherein the second patterned conductive layer 150' is located between the chip 180 and the first patterned conductive layer 150. The bonding wire 190 connects between the chip 180 and the second patterned conductive layer 150'. The molding compound M encapsulates the second patterned conductive layer 150', the chip 180 and the bonding wires 190.

In addition, the quad flat non-leaded package 100 further comprises a dielectric layer 170, a first oxidation prevention layer 160 and a second oxidation prevention layer 160'. The dielectric layer 170 is filled into the first space S1 and overlaps the second space S2 and the part of the second patterned conductive layer 150' surrounding the second space S2. The first oxidation prevention layer 160 is disposed on the first patterned conductive layer 150, wherein the first patterned conductive layer 150 is located between the first oxidation prevention layer 160 and the second patterned conductive layer 150'. The second oxidation prevention layer 160' is disposed on the second patterned conductive layer 150', wherein the second patterned conductive layer 150' is located between the second oxidation prevention layer 160' and the first patterned conductive layer 150.

Figure 2:
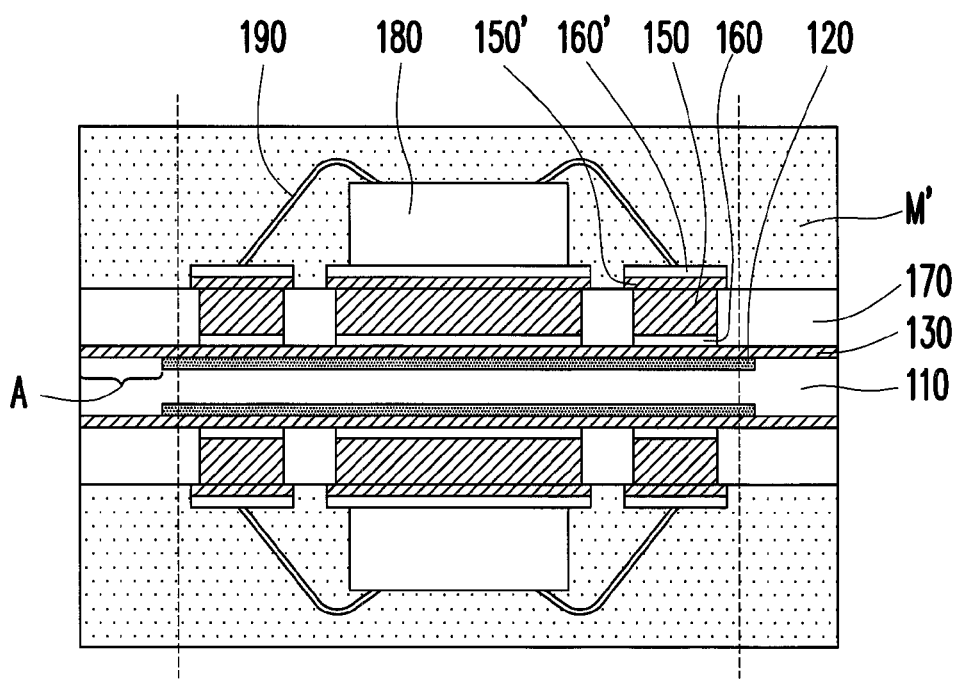
FIG. 2 is a sectional view showing a method of manufacturing a quad flat non-leaded package according to another embodiment of the present invention.

A method of manufacturing a quad flat non-leaded package according to another embodiment of the present invention is presented in the following. FIG. 2 is a sectional view showing a method of manufacturing a quad flat non-leaded package according to another embodiment of the present invention. Former process of the manufacturing method of this embodiment is similar to the steps illustrated in FIGS. 1A to 1F, and thus the detailed descriptions are not repeated herein.

Referring to FIGS. 1F and 2, a chip 180 is disposed on each second patterned conductive layer 150'. Bonding wires 190 are formed to electrically connect each chip 180 to its corresponding first patterned conductive layer 150 and second patterned conductive layer 150. Then, two molding compounds M' are formed to encapsulate the chips 180 and the bonding wires 190 connected to the chips 180.

Next, the molding compound M', the dielectric layers 170, the metal layers 130, the release films 120 and the sacrificed layer 110 are cut to remove the area A of the sacrificed layer 110 exposed by the release films 120. Then, the sacrificed layer 110 and the release films 120 are removed to obtain two quad flat non-leaded packages 100 as shown in FIG. 1H.

Figure 3:
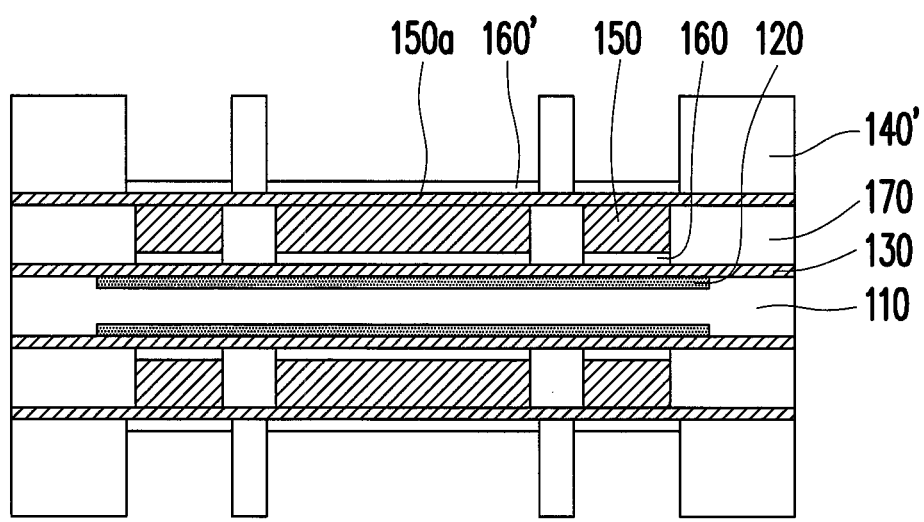
FIG. 3 is a sectional view showing a method of manufacturing a quad flat non-leaded package according to another embodiment of the present invention.

A method of manufacturing a quad flat non-leaded package according to further another embodiment of the present invention is presented in the following. FIG. 3 is a sectional view showing a method of manufacturing a quad flat non-leaded package according to another embodiment of the present invention. Former process of the manufacturing method of this embodiment is similar to the steps illustrated in FIGS. 1A to 1D, and thus the detailed descriptions are not repeated herein.

Referring to FIGS. 1D and 3, a conductive layer 150a is formed on each dielectric layer 170, wherein each conductive layer 150a overlaps the corresponding dielectric layer 170 and the first patterned conductive layer 150. Then, a second mask layer 140' is formed on each conductive layer 150a, wherein each second mask layer 140' exposes a part of the corresponding conductive layer 150a. A second oxidation prevention layer 160' is formed on the part of each conductive layer 150a exposed by the corresponding second mask layer 140'.

Then, each second mask layers 140' is removed and each conductive layer 150a is patterned to form a second patterned conductive layer 150' to obtain the structure as shown in FIG. 1F. The following process of the manufacturing method of this embodiment is similar to the step illustrated in FIGS. 1F to 1H, and thus the detailed descriptions are not repeated herein.

A method of manufacturing a quad flat non-leaded package according to further another embodiment of the present invention is presented in the following. FIGS. 4A to 4E are sectional views showing a method of manufacturing a quad flat non-leaded package according to further another embodiment of the present invention. Former process of the manufacturing method of this embodiment is similar to the steps illustrated in FIGS. 1A to 1B, and thus the detailed descriptions are not repeated herein.

Figure 4A:
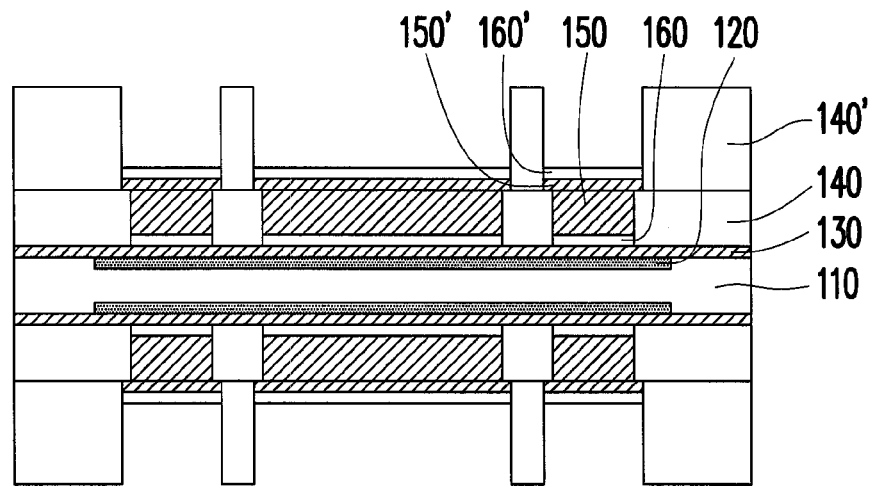
FIGS. 4A to 4E are sectional views showing a method of manufacturing a quad flat non-leaded package according to further another embodiment of the present invention.

Referring to FIGS. 1B and 4A, a second mask layer 140' is formed on each first mask layer 140, wherein each second mask layer 140' exposes the corresponding first patterned conductive layer 150 and a part of the first mask layer 140 surrounding the first patterned conductive layer 150. Then, a second patterned conductive layer 150' is formed on the first patterned conductive layer 150 and the part of the first mask layer 140 surrounding the first patterned conductive layer 150 exposed by each second mask layer 140'. In this embodiment, a second oxidation prevention layer 160' can be further formed on each second patterned conductive layer 150'.

Figure 4B:
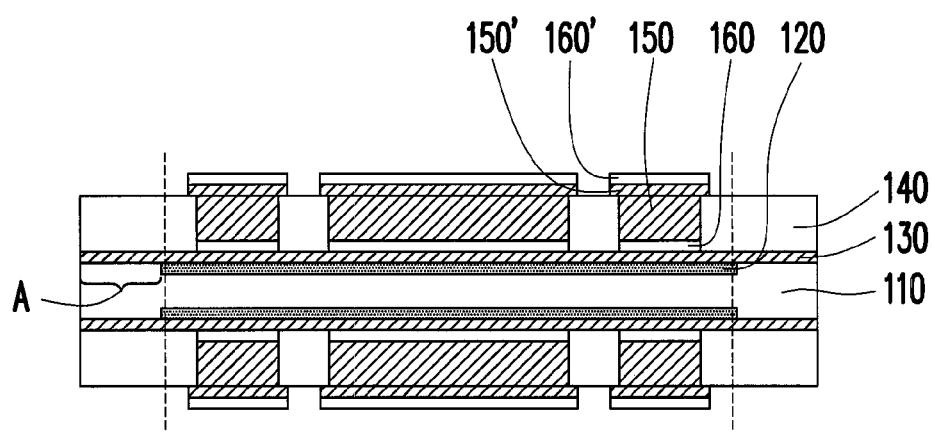
Figure 4C:
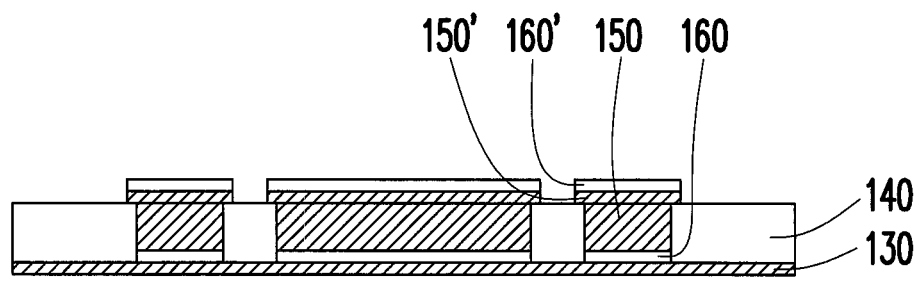

Referring to FIGS. 4B and 4C, each second mask layer 140' is removed. Then, the first mask layers 140, the metal layers 130, the release films 120 and the sacrificed layer 110 are cut to remove the area A of the sacrificed layer 110 exposed by the release films 120. Next, the sacrificed layer 110 and the release films 120 are removed.

Figure 4D:
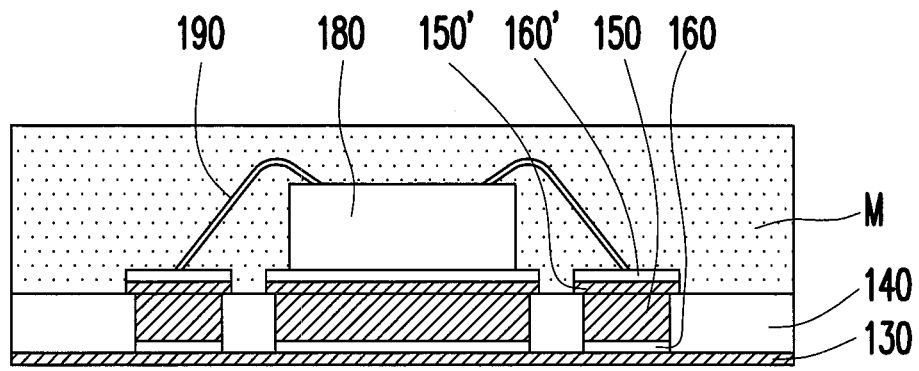

Referring to FIG. 4D, a chip 180 is disposed on the first patterned conductive layer 150. Bonding wires 190 are formed to electrically connect the chip 180 to the first patterned conductive layer 150. Then, a molding compound M is formed to encapsulate the chip 180 and the bonding wires 190 connected to the chip 180. Next, referring to FIG. 4E, the metal layer 130 and the first mask layer 140 are removed in sequence to obtain a quad flat non-leaded package 100'.

Figure 4E:
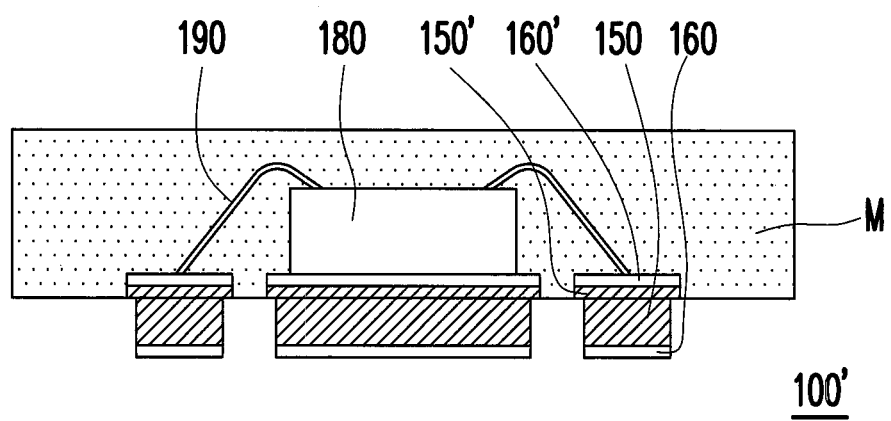

Referring to FIG. 4E, comparing to the quad flat non-leaded package 100 of FIG. 1H, the quad flat non-leaded package 100' of the embodiment does not have the dielectric layer 170, and a part of the second patterned conductive layer 150' surrounding the second space S2 is exposed.

The present invention disposes release films on a part area of the sacrificed layer in manufacturing process of the quad flat non-leaded package, such that the metal layers can be adhered to the remained area of the sacrificed layer exposed by the release films. Then, the remained area of the sacrificed layer exposed by the release films is removed by cutting and the metal layers can directly separate from the sacrificed layer by peeling the metal layers from the release films, so that the efficiency of the manufacturing process can be improved. In addition, the quad flat non-leaded package of the present invention has lower package thickness.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
   a first patterned conductive layer, defining a first space having a pattern complementary to a pattern of the first patterned conductive layer;
   a second patterned conductive layer, defining a second space having a pattern complementary to a pattern of the second patterned conductive layer, wherein the first space overlaps the second space and a part of the second patterned conductive layer surrounding the second space;
   a chip, disposed on the second patterned conductive layer, wherein the second patterned conductive layer is located between the chip and the first patterned conductive layer;
   a plurality of bonding wires, connected between the chip and the second patterned conductive layer;
   a molding compound, encapsulating the second patterned conductive layer, the chip and the bonding wires;
   a second oxidation prevention layer, disposed on the second patterned conductive layer, wherein the second patterned conductive layer is located between the second oxidation prevention layer and the first patterned conductive layer; and
   a dielectric layer, filled in the first space and overlapping the second space and the part of the second patterned conductive layer surrounding the second space.

2. The chip package according to claim 1, wherein the part of the second patterned conductive layer surrounding the second space contacts a surface of the dielectric layer.

3. The chip package according to claim 1, wherein the molding compound covers a surface of the dielectric layer.

4. The chip package according to claim 1, further comprising:

a first oxidation prevention layer, disposed on the first patterned conductive layer, wherein the first patterned conductive layer is located between the first oxidation prevention layer and the second patterned conductive layer, and a surface of the first oxidation prevention layer is coplanar to a surface of the dielectric layer.

5. A chip package, comprising:
a first patterned conductive layer having a first upper surface and a first lower surface;
a dielectric layer encapsulating the first patterned conductive layer and exposing the first upper surface and the first lower surface, wherein the first lower surface is sunken in the dielectric layer;
a second patterned conductive layer having a second upper surface and a second lower surface, wherein the first upper surface directly connects to the second lower surface;
a chip disposed on the second upper surface of the second patterned conductive layer;
a plurality of bonding wires electrically connecting the chip and the second patterned conductive layer; and
a package body encapsulating the second patterned conductive layer, the chip and the bonding wires.

6. The chip package according to claim 5, wherein an area of the first upper surface of the first patterned conductive layer is smaller than an area of the second lower surface of the second patterned conductive layer.

7. The chip package according to claim 5, wherein the part of the second lower surface of the second patterned conductive layer contacts an upper surface of the dielectric layer.

8. The chip package according to claim 5, further comprising:
a first oxidation prevention layer disposed on the lower surface of the first patterned conductive layer, wherein a surface of the first oxidation prevention layer is coplanar to a surface of the dielectric layer.

9. The chip package according to claim 5, wherein sides of the package body are coplanar to sides of the dielectric layer.

10. The chip package according to claim 5, wherein the first patterned conductive layer is thicker than the second patterned conductive layer.

11. The chip package according to claim 5, further comprising:
a second oxidation prevention layer disposed on the second upper surface of the second patterned conductive layer.

12. The chip package according to claim 11, wherein the chip is disposed on the second oxidation prevention layer.

* * * * *